United States Patent
Chen et al.

(10) Patent No.: US 12,322,612 B2
(45) Date of Patent: Jun. 3, 2025

(54) HEATING DEVICE AND HEATING METHOD FOR SEMICONDUCTOR THERMAL PROCESS

(71) Applicant: CHANGXIN MEMORY TECHNOLOGIES, INC., Hefei (CN)

(72) Inventors: Wanzheng Chen, Hefei (CN); Le Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 763 days.

(21) Appl. No.: 17/647,479

(22) Filed: Jan. 10, 2022

(65) Prior Publication Data

US 2023/0012618 A1  Jan. 19, 2023

Related U.S. Application Data

(63) Continuation of application No. PCT/CN2021/112204, filed on Aug. 12, 2021.

(30) Foreign Application Priority Data

Jul. 12, 2021  (CN) .................. 202110783905.0

(51) Int. Cl.
*H01L 21/67* (2006.01)
(52) U.S. Cl.
CPC .. *H01L 21/67103* (2013.01); *H01L 21/67248* (2013.01)
(58) Field of Classification Search
CPC ......... H01L 21/67098; H01L 21/67103; H01L 21/67109; H01L 21/67248
USPC .............................................. 219/404, 444.1
See application file for complete search history.

(56) References Cited

U.S. PATENT DOCUMENTS

| 6,072,163 A | 6/2000 | Armstrong et al. |
| 8,025,925 B2* | 9/2011 | Fukuoka ........... H01L 21/67109 118/724 |
| 2001/0035131 A1* | 11/2001 | Sakuma ........... H01L 21/67115 118/724 |
| 2006/0186109 A1* | 8/2006 | Goto ................. H01L 21/67103 219/444.1 |
| 2017/0346370 A1* | 11/2017 | Sentis .................... H02K 5/203 |

(Continued)

FOREIGN PATENT DOCUMENTS

| CN | 1591774 A | 3/2005 |
| CN | 111752111 A | 10/2020 |
| CN | 112040571 A | 12/2020 |

(Continued)

OTHER PUBLICATIONS

International Search Report cited in PCT/CN2021/112204 mailed Apr. 20, 2022, 9 pages.

*Primary Examiner* — Sang Y Paik
(74) *Attorney, Agent, or Firm* — Syncoda LLC; Feng Ma

(57) ABSTRACT

The present disclosure provides a heating device and heating method for a semiconductor thermal process. The heating device includes: a first heating portion, on which a wafer to-be-heated is placed; a second heating portion, where the first heating portion and the second heating portion are arranged in parallel, and the second heating portion is configured to heat the first heating portion; and an adjustment portion, configured to adjust a vertical distance between the first heating portion and the second heating portion.

10 Claims, 2 Drawing Sheets

(56) References Cited

U.S. PATENT DOCUMENTS

2018/0155838 A1* 6/2018 Rasheed .......... H01L 21/68785

FOREIGN PATENT DOCUMENTS

| | | |
|---|---|---|
| CN | 112420591 A | 2/2021 |
| CN | 213256240 U | 5/2021 |
| JP | 2003224078 A | 8/2003 |

* cited by examiner

HEATING DEVICE AND HEATING METHOD FOR SEMICONDUCTOR THERMAL PROCESS

CROSS-REFERENCE TO RELATED APPLICATIONS

This is a continuation of International Patent Application No. PCT/CN2021/112204, filed on Aug. 12, 2021, which claims the priority to Chinese Patent Application No. 202110783905.0, titled "HEATING DEVICE AND HEATING METHOD FOR SEMICONDUCTOR THERMAL PROCESS" and filed on Jul. 12, 2021. The entire contents of International Patent Application No. PCT/CN2021/112204 and Chinese Patent Application No. 202110783905.0 are incorporated herein by reference.

TECHNICAL FIELD

The present disclosure relates to, but is not limited to, a heating device and heating method for a semiconductor thermal process.

BACKGROUND

In the semiconductor industry, the photolithographic process is to develop a pattern on a silicon wafer or other wafers by coating, soft baking, exposure, development, and hard baking.

In the photolithographic process, after the photoresist coating, development and exposure, a multi-step baking process is required, and the thermal process is performed in a coater & developer. The temperature uniformity of a thermal plate in the thermal process directly affects the thickness uniformity of the coating film and the uniformity of key dimensions.

SUMMARY

An overview of the subject matter detailed in the present disclosure is provided below, which is not intended to limit the protection scope of the claims.

The present disclosure provides a heating device and a heating method for a semiconductor thermal process.

A first aspect of the present disclosure provides a heating device for a semiconductor thermal process, including:
 a first heating portion, on which a wafer to-be-heated is placed;
 a second heating portion, where the first heating portion and the second heating portion are arranged in parallel, and the second heating portion is configured to heat the first heating portion; and
 an adjustment portion, configured to adjust a vertical distance between the first heating portion and the second heating portion.

A second aspect of the present disclosure provides a heating method for a semiconductor thermal process, including:
 obtaining a temperature uniformity parameter of a wafer surface;
 determining adjustment parameters based on a preset threshold range and the temperature uniformity parameter; and
 adjusting a positional relationship between a first heating portion and a second heating portion by an adjustment portion based on the adjustment parameters.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the photolithographic process, a wafer and a thermal plate are arranged in a non-contact manner during the thermal process, and the thermal plate and the wafer are separately fixed, and the thermal plate is used to heat the wafer. In the process of heating the wafer by using the thermal plate, if the wafer is unevenly heated, it will cause uneven photoresist film thickness, which will affect the uniformity of key dimensions.

Figure 1:
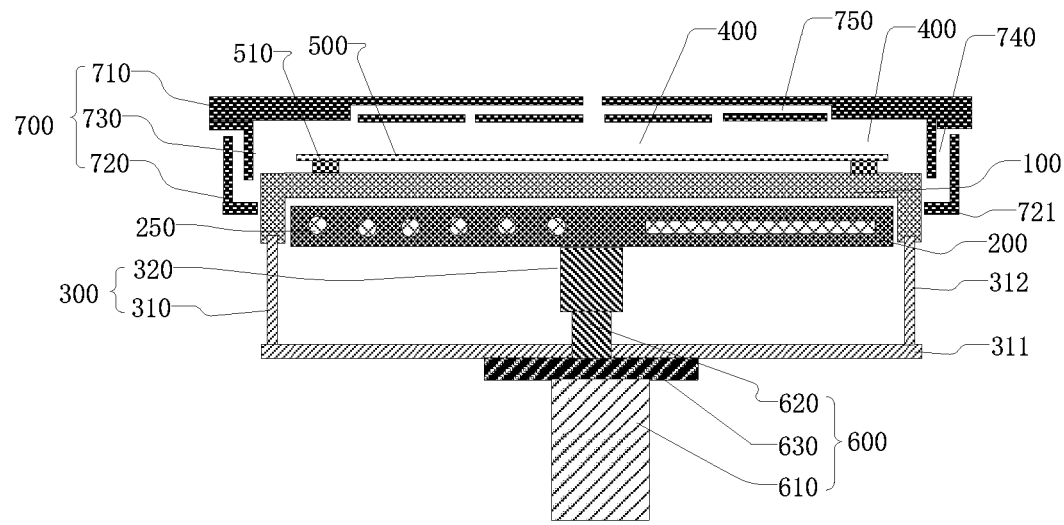
FIG. 1 is a schematic structural diagram of a heating device for a semiconductor thermal process according to an exemplary embodiment.

In view of this, an exemplary embodiment of the present disclosure provides a heating device for a semiconductor thermal process. As shown in FIG. 1, the heating device includes: a first heating portion 100 for placing a wafer to-be-heated, a second heating portion 200 which is arranged in parallel to the first heating portion 100 for heating the first heating portion 100, and an adjustment portion 300 for adjusting a vertical distance between the first heating portion 100 and the second heating portion 200.

When the wafer is heated, the wafer is placed above the first heating portion 100, and the first heating portion 100 heats the wafer. The vertical distance between the second heating portion 200 and the first heating portion 100 may be adjusted by the adjustment portion 300, to adjust a temperature at which the first heating portion 100 heats the wafer, such that the first heating portion 100 uniformly heats the wafer.

In the heating device of this embodiment, the first heating portion 100 and the second heating portion 200 are separately arranged. The second heating portion 200 radiates heat to heat the first heating portion 100, and then the first heating portion 100 radiates heat to heat the wafer. In this heating method, the temperature of the first heating portion 100 is more uniform, and local positions of the heating element do not undergo excessively high temperature. The temperature of the wafer is more uniform, a thickness of a wafer film obtained by heating is uniform, and key dimensions are precise and controllable. In this way, the quality of the wafer is better.

According to an exemplary embodiment, a heating device for a semiconductor thermal process of this embodiment is almost the same as that in the foregoing embodiment. As shown in FIG. 1, the adjustment portion 300 includes an adjustment bracket 310. The first heating portion 100 is connected to the adjustment bracket 310, and the adjustment bracket 310 drives the first heating portion 100 to move toward or away from the second heating portion 200.

The adjustment bracket 310 may be a telescopic bracket with an adjustable vertical height. The first heating portion 100 is directly connected to the adjustment bracket 310. An extending action or a retracting action of the adjustment bracket 310 drives the first heating portion 100 to move, so as to adjust the vertical distance between the first heating portion 100 and the second heating portion 200. Alternatively, the adjustment bracket 310 includes a power mechanism. The first heating portion 100 is connected to the adjustment bracket 310. The power mechanism drives the adjustment bracket 310 to drive the first heating portion 100 to move toward or away from the second heating portion 200, so as to adjust the vertical distance between the first heating portion 100 and the second heating portion 200.

In the semiconductor thermal process, when the temperature of the wafer is higher than a preset temperature threshold, the adjustment bracket 310 drives the first heating portion 100 to move away from the second heating portion 200, to reduce heat radiated by the second heating portion 200 to the first heating portion. In this way, the temperature of the first heating portion 100 is lowered, and the temperature of the wafer falls within a preset temperature threshold range. When the temperature of the wafer is lower than a preset temperature threshold, the adjustment bracket 310 drives the first heating portion 100 to move toward the second heating portion 200, to increase the heat radiated by the second heating portion 200 to the first heating portion 100. In this way, the temperature of the first heating portion 100 rises, and the temperature of the wafer rises to the preset temperature threshold range.

In this embodiment, as shown in FIG. 1, the adjustment bracket 310 includes a support unit 311 parallel to the first heating portion 100, and an adjustment unit 312 that is arranged perpendicular to an edge of the support unit 311 and that is connected to the edge of the support unit 311. The adjustment unit 312 is further connected to the first heating portion 100. When the adjustment unit 312 retracts, the first heating portion 100 moves toward the second heating portion 200; and when the adjustment unit 312 extends, the first heating portion 100 moves away from the second heating portion 200.

The support unit 311 and the first heating portion 100, which are parallelly arranged, are connected by the adjustment unit 312. When the adjustment bracket 310 adjusts the vertical distance between the first heating portion 100 and the second heating portion 200, the adjustment unit 312 extends or retracts, the support unit 311 and the first heating portion 100 remain in parallel, and a horizontal angle of the first heating portion 100 does not change, such that the first heating portion 100 and the second heating portion 200 are always in parallel during adjustment.

According to an exemplary embodiment, a heating device for a semiconductor thermal process in this embodiment is almost the same as that in the foregoing embodiment. As shown in FIG. 1, the adjustment portion 300 includes a first driving unit 320. The first driving unit 320 is connected to the second heating portion 200, and the first driving unit 320 drives the second heating portion 200 to move toward or away from the first heating portion 100.

In this embodiment, when the temperature of the wafer deviates from a preset temperature threshold, the vertical distance between the first heating portion 100 and the second heating portion 200 may be adjusted by the adjustment bracket 310, or the first driving unit 320, or both the adjustment bracket 310 and the first driving unit 320.

If the vertical distance between the first heating portion 100 and the second heating portion 200 is adjusted by the adjustment bracket 310 and the first driving unit 320, when the temperature of the wafer is higher than the preset temperature threshold, the adjustment bracket 310 drives the first heating portion 100 to move away from the second heating portion 200, and the first driving unit 320 drives the second heating portion 200 to move away from the first heating portion 100. In this way, the temperature of the first heating portion 100 is lowered, such that the temperature of the heated wafer is lowered to the preset temperature threshold. When the temperature of the wafer is lower than the preset temperature threshold, the adjustment bracket 310 drives the first heating portion 100 to move toward the second heating portion 200, and the first driving unit 320 drives the second heating portion 200 to move toward the first heating portion 100. In this way, the temperature of the first heating portion 100 rises, such that the temperature of the wafer rises to the preset temperature threshold.

According to the heating device for a semiconductor thermal process of this embodiment, when the temperature of the wafer deviates from the preset temperature threshold, the temperature is adjusted by both the adjustment bracket 310 and the first driving unit 320, such that the first heating portion 100 and the second heating portion 200 move in opposite directions, to accelerate the speed at which the first heating portion 100 and the second heating portion 200 move toward or away from each other, thereby shortening the time required to adjust the temperature of the wafer to the preset temperature threshold. In this way, the adjustment efficiency is higher and the adjustment speed is faster.

According to an exemplary embodiment, a heating device for a semiconductor thermal process of this embodiment is almost the same as that of the foregoing embodiment. As shown in FIG. 1, the difference lies in that the heating device further includes a wafer holder 500 mounted on the first heating portion 100, and the wafer holder 500 is arranged on a side of the first heating portion 100 away from the second heating portion 200. The wafer holder 500 is configured to carry the wafer to-be-baked. The wafer holder 500 includes a telescopic unit 510 for adjusting the height of the wafer holder 500.

When the wafer is heated, the wafer holder 500 carries the wafer, and the height of the wafer holder 500 is adjusted by the telescopic unit 510, to adjust the distance between the wafer and the first heating portion 100, such that the first heating portion 100 heats the wafer uniformly.

According to an exemplary embodiment, a heating device for a semiconductor thermal process of this embodiment is almost the same as that of the foregoing embodiment. As shown in FIG. 1, the difference lies in that the heating device further includes a second driving unit 600 connected to the second heating portion 200. The second driving unit 600 is configured to drive the second heating portion 200 to rotate.

The second driving unit 600 may drive the second heating portion 200 to rotate clockwise or counterclockwise. For example, the second driving unit 600 may drive the second heating portion 200 to rotate clockwise at a predetermined speed, or rotate counterclockwise at a predetermined speed, or rotate clockwise and counterclockwise alternately.

During the entire rotation period, heat radiated by the second heating portion 200 to all the positions of the first heating portion 100 is more uniform. Moreover, the first heating portion 100 and the second heating portion 200 are separately arranged, and the second heating portion 200 will not rub the first heating portion 100 when rotating. This can prevent the device from being damaged by rubbing between the second heating portion 200 and the first heating portion 100.

The heating device of this embodiment avoids the following problem: The relative position of the second heating portion 200 and the first heating portion 100 keeps unchanged, causing a temperature of a local position of the first heating portion 100 higher than that of other positions. In this way, temperatures of different positions of the first heating portion 100 are uniform, such that the wafer is heated uniformly.

As shown in FIG. 1, the second driving unit 600 includes a motor 610, a transmission structure 620 connected to the motor 610, and a cooling portion 630 connected to the motor 610. The transmission structure 620 penetrates the support unit 311 of the adjustment bracket 310 to connect to the second heating portion 200, and the cooling portion 630 is attached to the support unit 311.

In this embodiment, the motor 610 drives the transmission structure 620 to rotate, and the rotation of the transmission structure 620 drives the second heating portion 200 to rotate. At the same time, the motor 610 is cooled by the cooling portion 630, to reduce the temperature of the motor 610. In this way, the rotation does not cause excessive high temperature of the motor 610, such that the service life of the motor 610 can be prolonged.

For example, the transmission structure 620 may be a telescopic structure, to be specific, the transmission structure 620 may further have the telescopic function of the first driving unit 320. This further simplifies the structure of the heating device.

Figure 2:
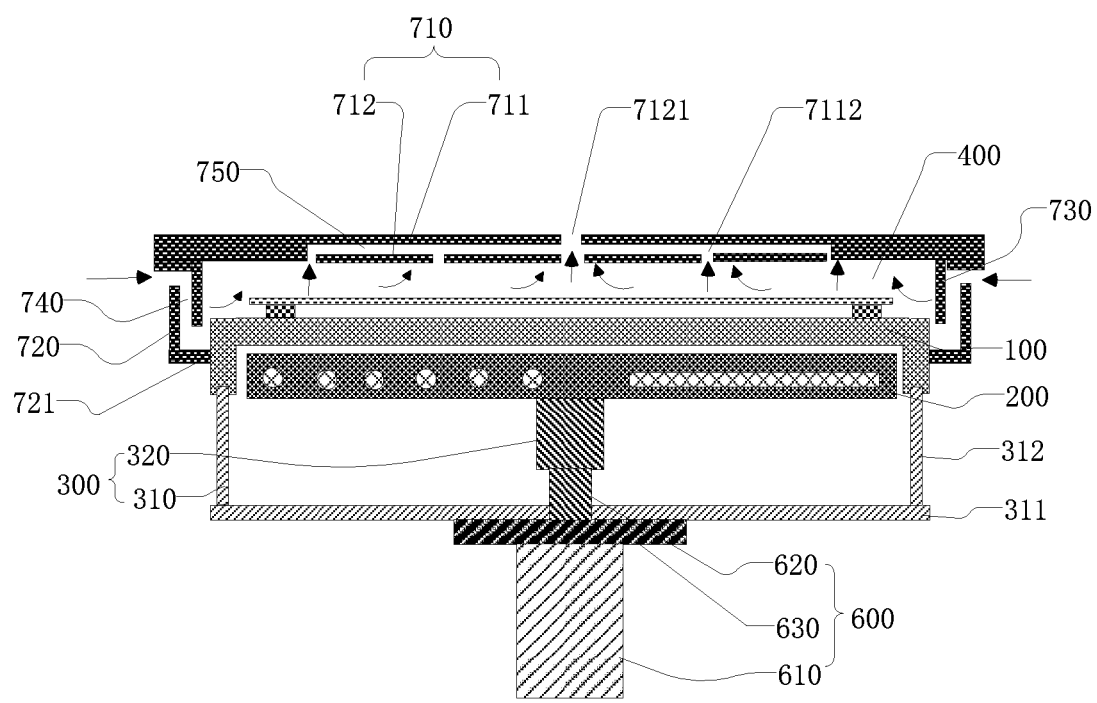
FIG. 2 is a schematic diagram of a flow direction of inert gas in a heating device for a semiconductor thermal process according to an exemplary embodiment.

According to an exemplary embodiment, a heating device for a semiconductor thermal process of this embodiment is almost the same as that of the foregoing embodiment. As shown in FIG. 1 and FIG. 2, the difference lies in that the heating device further includes a cover 700. The cover 700 is connected to the first heating portion 100, and a thermal cavity 400 is formed between the first heating portion 100 and the cover 700.

The cover 700 is provided with an air inlet channel 740 in communication with an external gas storage device and an air outlet channel 750. The gas storage device stores inert gas.

During the thermal process, the wafer is placed in the thermal cavity 400, and the inert gas at a predetermined temperature is introduced into the thermal cavity 400 through the air inlet channel 740 to provide an inert environment for heating the wafer. This prevents wafer oxidation from affecting the product yield during the thermal process.

In this embodiment, as shown in FIG. 1 and FIG. 2, the cover 700 includes a cover plate 710, a first side plate 720 connected to an edge of the cover plate 710, and a second side plate 730 connected to the cover plate 710. A fastening structure 721 is provided at the bottom of first side plate 720, the cover 700 covers the first heating portion 100, and the fastening structure 721 at the bottom of the first side plate 720 fastens the edge of the first heating portion 100. When the cover 700 and the first heating portion 100 are fastened, and the adjustment bracket 310 drives the first heating portion 100 to move toward or away from the second heating portion 200, the cover 700 follows the first heating portion 100 to move toward or away from the second heating portion 200.

As shown in FIG. 1 and FIG. 2, the second side plate 730 is arranged inside the first side plate 720, and a length of the second side plate 730 is shorter than that of the first side plate 720. The air inlet channel 740 is formed between the first side plate 720 and the second side plate 730, and an air inlet port (not shown) connected to the external air storage device is provided on the first side plate 720. The projection of the second side plate 730 on the first heating portion 100 can cover the first heating portion 100, and the bottom of the second side plate 730 is substantially flush with the top of the first heating portion 100.

As shown in FIG. 1 and FIG. 2, the cover plate 710 includes a first cover plate 711 connected to the first side plate 720 and the second side plate 730, a second cover plate 712 connected to the first cover plate 711, and the air outlet channel 750 formed between the first cover plate 711 and the second cover plate 712. The second cover plate 712 is arranged on a side of the first side plate 720 facing the first heating portion 100, the first cover plate 711 is provided with a first opening 7111, and the second cover plate 712 is provided with multiple second openings 7121.

In this embodiment, the number of the second openings 7121 on the second cover plate 712 is greater than that of the first openings 7111 on the first cover plate 711, such that the gas released by heating the wafer enters more quickly from the thermal cavity 400 into the air outlet channel 750. In this way, the released gas is prevented from flowing in the thermal cavity 400 and reducing the purity of the inert gas in the thermal cavity 400.

For example, the first opening 7111 is connected to an external air extraction device, and the external air extraction device accelerates the discharge of the gas in the thermal cavity 400 from the first opening 7111 to the outside of the device, so as to prevent the gas released by heating the wafer from flowing in the thermal cavity 400 and reducing the purity of the inert gas in the thermal cavity 400.

As shown in FIG. 2, after the inert gas in the gas storage device enters the air inlet channel 740 through the air inlet port, it enters the thermal cavity 400 through the space between the bottom of the second side plate 730 and the first heating portion 100. The inert gas flows to the wafer on the wafer holder 500 to uniformly heat the wafer, and then flows upward to be discharged from the air outlet channel 750 to the outside. The upward flow of the inert gas can take away other gases released by heating the wafer, to maintain the purity of the inert environment where the wafer is heated, and improve the quality of the wafer obtained by heating.

Figure 3:
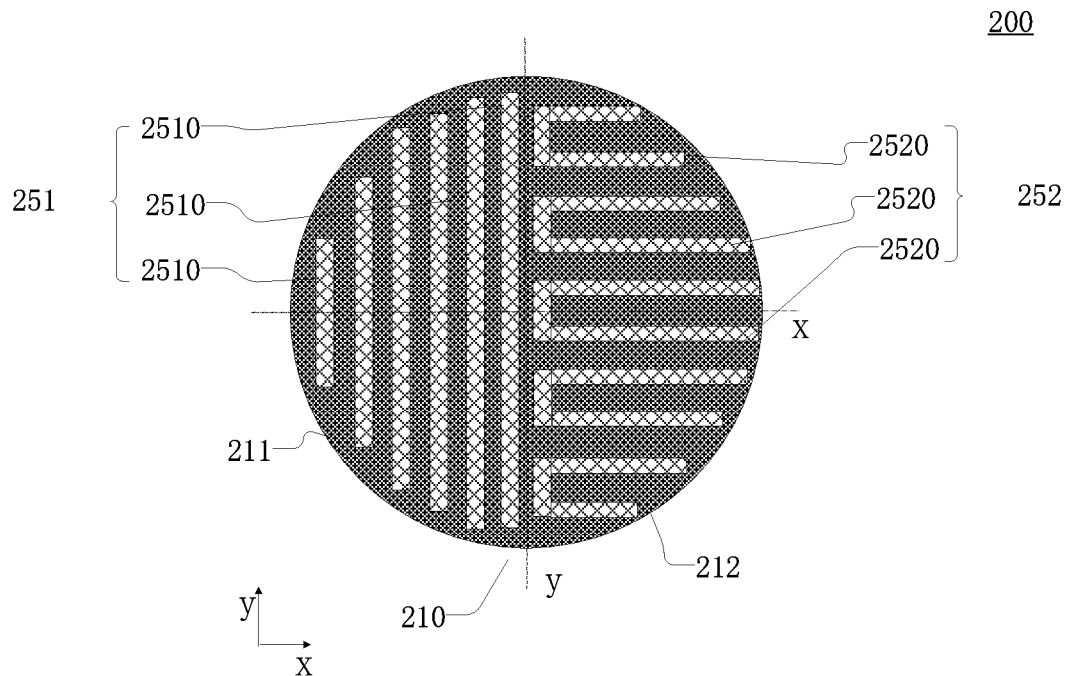
FIG. 3 is a schematic sectional diagram of a second heating portion according to an exemplary embodiment.

According to an exemplary embodiment, a heating device for a semiconductor thermal process of this embodiment is almost the same as that of the foregoing embodiment. As shown in FIG. 1 and FIG. 3, the second heating portion 200 includes a heating element 250, and the heating element 250 includes multiple heating subunits, and the multiple heating subunits are distributed asymmetrically.

As shown in FIG. 1 and FIG. 3, the second heating portion 200 further includes a body 210. The heating element 250 is arranged inside the body 210. The body 210 of the second heating portion 200 may be divided into multiple regions, and each region is provided with at least one heating subunit. Each heating subunit provides a different heat radiation method. The body 210 of the second heating portion 200 may be equally divided into two, three, four, or five regions, and each region is provided with one heating subunit. The heating subunit in each region is symmetric along the center line of the region, and the multiple heating subunits are distributed asymmetrically on the body 210.

In this embodiment, the body 210 of the second heating portion is equally divided into a first body 211 and a second body 212. The first body 211 is provided with a first heating subunit 251, and the second body 212 is provided with a second heating subunit 252.

The second heating portion 200 radiates heat to heat the first heating portion 100, and the first heating portion 100 radiates heat to heat the wafer. The temperature uniformity of the first heating portion 100 affects the temperature uniformity of the wafer. In this embodiment, the multiple heating subunits provide heat radiation to different regions of the first heating portion 100. The arrangement of the heating subunits is enriched to enable each region of the first heating portion 100 to receive the heat radiation. When the second heating portion 200 rotates, each position of the first heating portion 100 is sequentially heated by the multiple heating subunits, such that each position of the first heating portion 100 uniformly receives heat. This distribution manner of the heating subunits heats the first heating portion 100 more uniformly, such that the heat radiated by the first heating portion 100 to the wafer is uniform. In this way, the film thickness of the heated wafer is uniform, the key dimensions are more accurate, and the quality of the wafer is better.

According to an exemplary embodiment, a heating device for a semiconductor thermal process of this embodiment is almost the same as that of the foregoing embodiment. As shown in FIG. 1, a material of the first heating portion 100 includes ceramic. The ceramic has high heart radiation, high strength, high thermal conductivity, high insulation and good acid and alkali corrosion resistance. Moreover, the ceramic has high porosity. With a same heat radiation area, the first heating portion 100 has higher thermal conductivity to radiate more heat into the thermal cavity 400 to heat the wafer. The material of the first heating portion 100 in this embodiment may be silicon nitride, metal oxide, boride, or the like.

A material of the second heating portion 200 may be metal or alloy with high thermal conductivity, which can quickly rise in temperature. The material of the second heating portion 200 may include silver, copper, copper-aluminum alloy, or the like.

An exemplary embodiment of the present disclosure provides a heating device for a semiconductor thermal process. As shown in FIG. 1 and FIG. 2, the heating device includes a first heating portion 100, a second heating portion 200 arranged in parallel to the first heating portion 100, an adjustment portion 300 connected to an edge of the first heating portion 100, a wafer holder 500 arranged above the first heating portion 100, a second driving unit 600 that drives the second heating portion 200 to rotate, a cover 700 that covers the first heating portion 100, a thermal cavity 400 formed between the cover 700 and the first heating portion 100. The wafer holder 500 is located in the thermal cavity 400, and a wafer to-be-heated is placed on the wafer holder 500.

As shown in FIG. 1 and FIG. 2, the adjustment portion 300 includes an adjustment bracket 310 connected to the first heating portion 100 and a first driving unit 320 connected to the second heating portion 200. The adjustment bracket 310 drives the first heating portion 100 to move toward or away from the second heating portion 200. The first driving unit 320 is connected to the second heating portion 200, and the first driving unit 320 drives the second heating portion 200 to move toward or away from the first heating portion 100. A vertical distance between the first heating portion 100 and the second heating portion 200 is adjusted by the adjustment bracket 310 and the first driving unit 320.

As shown in FIG. 1 and FIG. 2, the adjustment bracket 310 includes a support unit 311 parallel to the first heating portion 100 and an adjustment unit 312 perpendicularly connected to an edge of the support unit 311. The adjustment unit 312 is further perpendicularly connected to the edge of the first heating portion 100. The adjustment unit 312 extends or retracts to adjust the vertical distance between the first heating portion 100 and the second heating portion 200. When the adjustment unit 312 retracts, the first heating portion 100 moves toward the second heating portion 200. When the adjustment unit 312 extends, the first heating portion 100 moves away from the second heating portion 200. In this embodiment, the adjustment unit 312 connects the first heating portion 100 and the support unit 311 as a whole. When the adjustment unit 312 extends or retracts to adjust the vertical distance between the first heating portion 100 and the second heating portion 200, a horizontal angle of the first heating portion 100 does not change, such that the first heating portion 100 and the second heating portion 200 are always in parallel.

As shown in FIG. 1 and FIG. 2, the second driving unit 600 includes a transmission structure 620 (the first driving unit 320 serves as the transmission structure 620 of the second driving unit 600), a motor 610, and a cooling portion 630 connected to the motor 610. One end of the transmission structure 620 is connected to the motor 610, and the other end passes through the support unit 311 of the adjustment bracket 310 to connect to the second heating portion 200. The cooling portion 630 is attached to the support unit 311. The motor 610 drives the transmission structure 620 to rotate, to drive the second heating portion 200 to rotate to heat the first heating portion 100.

As shown in FIG. 3, the second heating portion 200 includes a body 210 and a first heating subunit 251 and a second heating subunit 252 that are arranged in the body 210. The first heating subunit 251 and the second heating subunit 252 are distributed asymmetrically. The body 210 of the second heating portion includes a first body 211 and a second body 212 that are symmetrical along the center line in the second direction (that is, the y direction in FIG. 3). The first heating subunit 251 is arranged in the first body 211. The first heating subunit 251 includes multiple straight tube heaters 2510 horizontally arranged along the second direction, and the first heating subunit 251 is centrally symmetrical along the center line in the first direction (that is, the x direction in FIG. 3). The second heating subunit 252 is arranged in the second body 212. The second heating subunit 252 includes multiple U-shaped heaters 2520 arranged along the first direction, and the second heating subunit 252 is centrally symmetrical along the center line in the first direction.

As shown in FIG. 1, the wafer holder 500 is arranged on a side of the first heating portion 100 away from the second heating portion 200, the wafer holder 500 includes a telescopic unit 510, and a height of the telescopic unit 510 may be adjusted by telescoping.

As shown in FIG. 1 and FIG. 2, the cover 700 is arranged on the side of the first heating portion 100 away from the second heating portion 200, and the cover 700 is connected to the first heating portion 100 to form a thermal cavity 400. The cover 700 is provided with an air inlet channel 740 and an air outlet channel 750. The air inlet channel 740 is communicated with an external gas storage device, and the gas storage device stores inert gas.

A material of the first heating portion 100 is ceramic, and a material of the second heating portion 200 is metal.

In the heating device for a semiconductor thermal process of this embodiment, the vertical distance between the first heating portion and the second heating portion, the rotation speed of the second heating portion, and the vertical distance between the wafer and the first heating portion are all flexibly adjustable. The vertical distance between the first heating portion and the second heating portion, the rotation speed of the second heating portion, and the vertical distance between the wafer and the first heating portion are controlled to realize high uniformity in the temperature distribution of the first heating portion. The high uniformity in heating the wafer during the thermal process enables a more uniform film thickness and accurate and reliable key dimensions.

Figure 4:
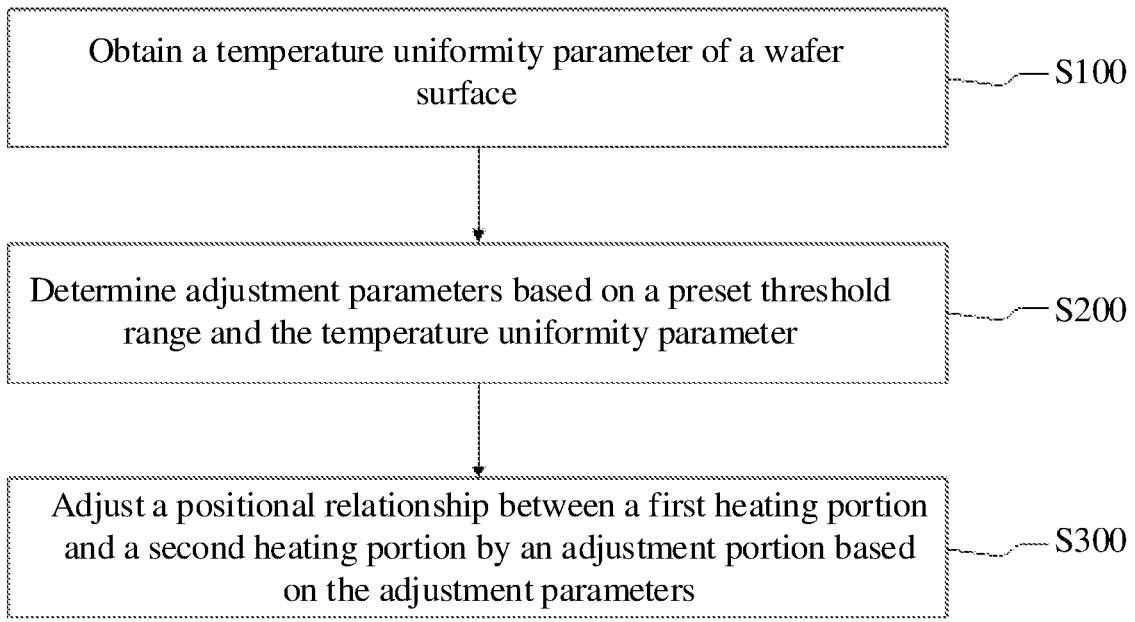
FIG. 4 is a flowchart of a heating method for a semiconductor thermal process according to an exemplary embodiment.

An exemplary embodiment of the present disclosure provides a heating method for a semiconductor thermal process. As shown in FIG. 4, FIG. 4 is a flowchart of a heating method for a semiconductor thermal process according to an exemplary embodiment of the present disclosure.

As shown in FIG. 4, the heating method for a semiconductor thermal process according to the exemplary embodiment of the present disclosure includes the following steps:

S100: Obtain a temperature uniformity parameter of a wafer surface.

A temperature and the temperature uniformity parameter of the wafer surface may be monitored in real time by a fault detection system (FDC).

S200: Determine adjustment parameters based on a preset threshold range and the temperature uniformity parameter.

The FDC compares the real-time temperature of the wafer surface with a preset temperature threshold. Whether the temperature of the wafer surface exceeds the preset temperature threshold is determined. The real-time temperature uniformity parameter is compared with a preset temperature uniformity parameter, to determine whether the temperature uniformity parameter of the wafer surface is lower than the preset temperature uniformity parameter. If at least one of the two determining results is "yes", it is determined that a temperature state of the wafer has deteriorated. The adjustment parameters are determined. The adjustment parameters include a vertical distance between a first heating portion and a second heating portion, a rotation speed of the second heating portion, and a vertical distance between the wafer and the first heating portion.

S300: Adjust a positional relationship between the first heating portion and the second heating portion by an adjustment portion based on the adjustment parameters.

The vertical distance between the first heating portion and the second heating portion is re-determined based on the adjustment parameters, then an adjustment bracket adjusts the first heating portion and a first driving unit adjusts the second heating portion, such that the first heating portion and the second heating portion move toward or away from each other until a predetermined vertical distance. The rotation speed is re-determined based on the adjustment parameters, and a second driving unit is adjusted to change the rotation speed of the second heating portion. The vertical distance between the wafer and the first heating portion is re-determined, and a height of an adjustment unit of an adjustment bracket is adjusted.

For example, step S200 of determining adjustment parameters based on a preset threshold range and the temperature uniformity parameter may include: determining a movement direction and a movement distance based on a difference between the preset threshold range and the temperature uniformity parameter.

When the temperature of the wafer surface is higher than the preset temperature threshold, it is determined that the first heating portion moves away from the second heating portion, the second heating portion moves away from the first heating portion, an adjustment direction of the adjustment unit of the adjustment bracket is upward, and the rotation speed of the second heating portion is reduced.

When the temperature of the wafer surface is lower than the preset temperature threshold, it is determined that the first heating portion moves toward the second heating portion, the second heating portion moves toward the first heating portion, an adjustment direction of the adjustment unit of the adjustment bracket is downward, and the rotation speed of the second heating portion is increased.

When the temperature uniformity parameter is lower than the preset temperature uniformity parameter, the rotation speed of the second heating portion is increased, and the distance between the first heating portion and the second heating portion is adjusted at the same time.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the heating device and heating method for a semiconductor thermal process provided in the embodiments of the present disclosure, the temperature of the first heating portion can be adjusted by adjusting the vertical distance between the second heating portion and the first heating portion, such that the first heating portion heats the wafer uniformly.

The invention claimed is:

1. A heating device for a semiconductor thermal process, comprising:
   a first heating portion, on which a wafer to-be-heated is placed;
   a second heating portion, wherein the first heating portion and the second heating portion are arranged in parallel, and the second heating portion is configured to heat the first heating portion; and
   an adjustment portion, configured to adjust a vertical distance between the first heating portion and the second heating portion;
   wherein the heating device further comprises a wafer holder, and the wafer holder is arranged on a side of the first heating portion away from the second heating portion; and the wafer is mounted on the wafer holder, wherein the wafer holder comprises a telescopic unit, and the telescopic unit is configured to adjust a height of the wafer holder.

2. The heating device for a semiconductor thermal process according to claim 1, wherein
   the adjustment portion comprises an adjustment bracket, and the first heating portion is connected to the adjustment bracket; and
   the adjustment bracket drives the first heating portion to move toward or away from the second heating portion.

3. The heating device for a semiconductor thermal process according to claim 2, wherein
   the adjustment bracket comprises a support unit parallel to the first heating portion, an adjustment unit perpendicular to the support unit is arranged on an edge of the support unit, and the adjustment unit is connected to the first heating portion;
   when the adjustment unit retracts, the first heating portion moves toward the second heating portion; and
   when the adjustment unit extends, the first heating portion moves away from the second heating portion.

4. The heating device for a semiconductor thermal process according to claim 1, wherein
   the adjustment portion comprises a first driving unit, the first driving unit is connected to the second heating portion, and the first driving unit drives the second heating portion to move toward or away from the first heating portion.

5. The heating device for a semiconductor thermal process according to claim 1, wherein
   the heating device further comprises a driving unit, and the driving unit is connected to the second heating portion; and
   the driving unit is configured to drive the second heating portion to rotate.

6. The heating device for a semiconductor thermal process according to claim 1, wherein
   the heating device further comprises a cover, the cover is connected to the first heating portion, and a thermal cavity is formed between the first heating portion and the cover.

7. The heating device for a semiconductor thermal process according to claim 6, wherein
   the cover is provided with an air inlet channel and an air outlet channel; and
   the air inlet channel is communicated with an external gas storage device, and inert gas is stored in the external gas storage device.

8. The heating device for a semiconductor thermal process according to claim 1, wherein
   the second heating portion comprises a heating element; and
   the heating element comprises multiple heating subunits, and the multiple heating subunits are distributed asymmetrically.

9. The heating device for a semiconductor thermal process according to claim 1, wherein
   a material of the first heating portion comprises ceramic.

10. The heating device for a semiconductor thermal process according to claim 1, wherein
    a material of the second heating portion comprises metal.

* * * * *